United States Patent [19]

Selkow, Jr.

[11] 4,092,587
[45] May 30, 1978

[54] CONTACT PROTECTION TEST SET

[75] Inventor: Charles Fred Selkow, Jr., Reynoldsburg, Ohio

[73] Assignee: Bell Telephone Laboratories, Incorporated, Murray Hill, N.J.

[21] Appl. No.: 719,614

[22] Filed: Sep. 1, 1976

[51] Int. Cl.² ............................................. G01R 31/02
[52] U.S. Cl. ............................... 324/28 R; 324/158 P; 339/255 P
[58] Field of Search ............... 324/28 R, 28 CR, 72.5, 324/149, 158 F, 158 P, 73 PC; 339/255 P

[56] References Cited
U.S. PATENT DOCUMENTS

| 999,977 | 8/1911 | Fish | 324/149 |
|---|---|---|---|
| 1,638,438 | 8/1927 | Gottschalk | 324/72.5 |
| 2,889,519 | 6/1959 | Montgomery | 324/149 |

FOREIGN PATENT DOCUMENTS 744,326  2/1956  United Kingdom ................ 324/72.5

Primary Examiner—Rudolph V. Rolinec
Assistant Examiner—Michael J. Tokar
Attorney, Agent, or Firm—Dwight A. Marshall

[57] ABSTRACT

A test set for testing relay contact protection networks comprising a signal generator coupled to an analyzing circuit and a test connector arranged for enabling the test set to be used for in-circuit testing of contact protection networks. The test connector is constructed of two elongated insulating members each having a tapered operative arm on which contact elements coupled to the analyzing circuit are mounted. Hinge apparatus supports the two elongated members and enables both angular and parallel lateral relative movement of each of the tapered operative arms to selectively connect the contact elements with ones of the contact protection networks.

6 Claims, 5 Drawing Figures

CONTACT PROTECTION TEST SET

BACKGROUND OF THE INVENTION

This invention relates to a test set for testing relay contact protection networks. In particular it relates to apparatus arranged for coupling the test set to various contact protection networks located in relay contact controlled circuits.

Typically, relay contacts are used in the field of communications to control transmission and switching circuits to establish communication paths between calling and called telephone stations. During operation, a relay contact closes and opens contact surfaces which result in abrupt changes in the electrical states appearing at the contact surfaces and lead to surges of voltage and current with associated breakdowns in the gap between the contact surfaces. These surges lead to localized heating at the contact surfaces and cause vaporization, welding, and brief high frequency oscillations in the contact controlled circuitry that sometimes cause external radiation interference and damage to wiring and components. The energy dissipated in the gap breakdown causes erosion of the contact metals which eventually wear through to poor conducting base metals upon which the contact metals have been plated. Erosion of the contact surfaces can also produce metallic bridges to short circuit contact surfaces and cause contacts to latch together so that they fail to separate.

There are many contact uses where the damage caused by voltage and current surges severely shortens the service life of the contact surface metal. Circuits controlled by the closing and opening of relay contacts are oftentimes modified by the addition of a contact protection network intended to protect the relay contact surfaces and thereby enable the contacts to serve their intended service life. The opening of an inductive circuit is the principal offender as to contact erosion, radiation interference, and gap breakdown damage to the high voltage surges. Contact protection networks comprise resistive, capacitive, and other linear and nonlinear elements, or combinations thereof, and are connected across relay coil windings located in contact controlled circuits to dissipate contact energy by limiting contact voltage and current.

Contact protection networks sometimes fail in service and thereby allow damage to occur to the unprotected contact surfaces. The unprotected contacts in turn fail and prevent proper operation of the relay in performing the task of controlling the circuit. The past procedure for testing contact protection networks has been to remove suspected networks from relay controlled circuits and connect them to a test bridge circuit that is operated to measure the value of the network. This procedure requires that a circuit suspected of having a defective contact protection network must be removed from service while each contact protection network is disconnected from across a relay coil winding, removed from the circuit, measured on a test bridge circuit and reconnected after testing to the circuit relay coil winding.

A need exists in the art for a test set arranged to allow rapid in-circuit testing of contact protection networks. A need also exists for apparatus arranged to selectively connect a test set to various relay coil winding configurations for the purpose of enabling the test set to be used to test various types of contact protection networks connected thereto.

SUMMARY OF THE INVENTION

In the exemplary embodiment of the invention, test set apparatus for testing contact protection networks is arranged to allow rapid in-circuit testing of various types of contact protection networks connected to different relay contact controlled circuit configurations. The test set apparatus comprises a test signal generator and a contact protection network analyzing circuit coupled to a test connector arranged for enabling the test set to be used for in-circuit testing of relay contact protection networks. The test connector is constructed of two insulating elongated members each having a tapered operative end and each assembled on hinge plates arranged to permit both angular and parallel lateral relative movement of the tapered operative ends of the two elongated members. First contact elements connected with the contact protection network analyzing circuit are attached to an inside facing surface of each tapered operative end of the elongated members. A second contact element is mounted on and attached to a tapered surface of the tapered operative end of one of the elongated members opposite the first contact element thereof. The second contact element on the one elongated member is electrically connected to the first contact element attached to the tapered operative end of the other elongated member. The test connector is constructed so that the first contact elements mounted on the inside facing surface of the tapered operative ends of both elongated members in combination with the second contact element mounted on the tapered surface of the tapered operative end of one elongated member enable the test set to be selectively connected to various in-circuit relay contact protection networks.

In accordance with one feature of the invention, a test set for testing contact protection networks comprises apparatus for generating a test signal and for analyzing the contact protection networks in response to the application of the test signal thereto. Connecting apparatus comprising a pair of insulating elongated members each having a tapered operative end is provided with contact means attached to the tapered operative end of one of the elongated members and to the tapered operative ends of both elongated members. Hinge means support the elongated members and enable both angular and parallel lateral relative movement thereof to selectively couple the contact means with ones of the contact protection networks. Conductor means secured to the elongated members couple the contact means with the analyzing apparatus.

In accordance with another feature of the invention, a test set for testing relay contact protection networks includes apparatus for analyzing ones of the contact protection networks in response to the application of a test signal thereto. The analyzing apparatus comprises bridge circuitry arranged to rectify a portion of the test signal applied to a contact protection network under test and to apply the rectified test signal to a meter calibrated to define an operational status of the tested contact protection network in accordance with predetermined values of rectified test signals applied thereto.

In accordance with still another feature of the invention, a test connector for use with a test set to test relay contact protection networks comprises a pair of insulating elongated members each having a tapered operative arm. A pair of first contact elements are each individually mounted on an inside facing suface of the tapered operative arm of each elongated member and a second contact element is mounted on a tapered surface of the tapered operative arm of one elongated member opposite the first contact element attached thereto. A pair of hinge plates support the elongated members and enable both angular and parallel lateral relative movement of the tapered operative arms to selectively couple the first and second contact elements with ones of the contact protection networks to be tested with the test set apparatus.

DESCRIPTION OF THE DRAWING

The foregoing, as well as other objects, features and advantages of the invention, will be more apparent from a description of the drawing in which.

DESCRIPTION OF THE INVENTION

1. Description

Figure 1:
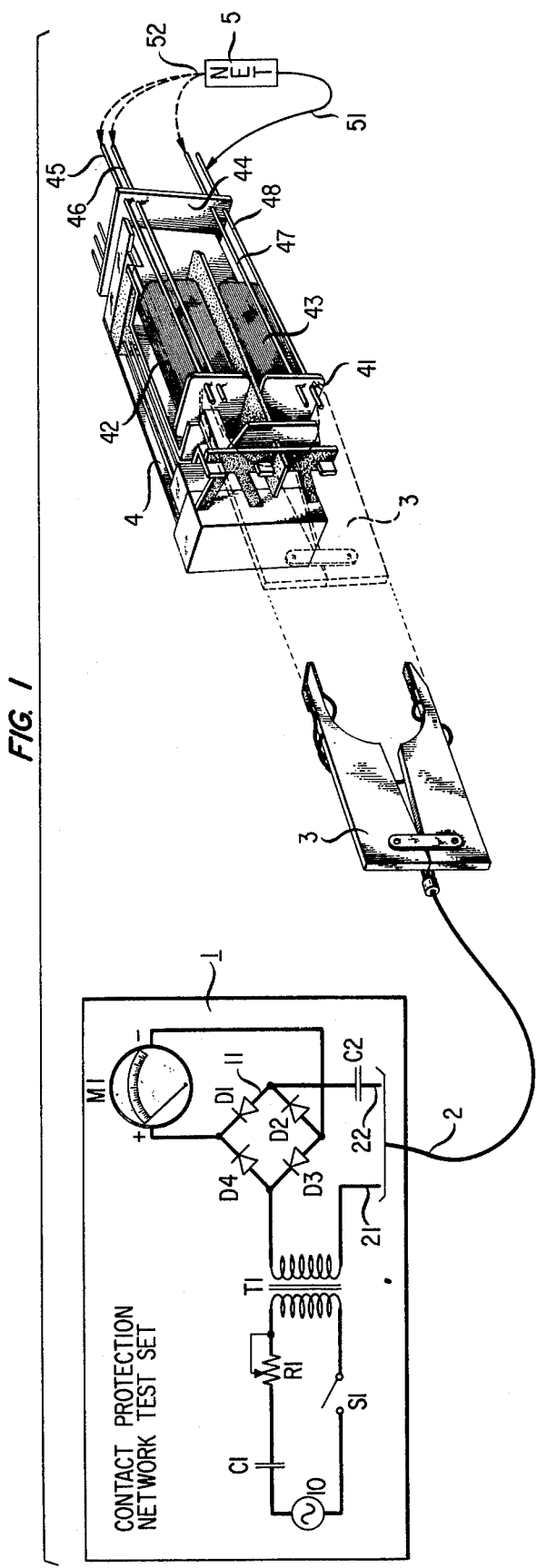
FIG. 1 illustrates a relay contact protection network test set setting forth the interrelationship of the various components comprising an illustrative embodiment of the invention.

Referring to FIG. 1 of the drawing, test set 1 is intended for use in the in-circuit testing of relay contact protection networks such as contact protection network 5. The apparatus of test set 1 comprises a generator 10 for generating a test signal that is applied via test connector 3 to a contact protection network 5 that is under test. Although it is to be understood that the frequency of the generated test signal may be varied to suit specific test applications the value of 2200 hertz has been found satisfactory for use in testing contact protection networks normally associated with the wire spring type of relays often found in communications switching systems.

Figure 4:
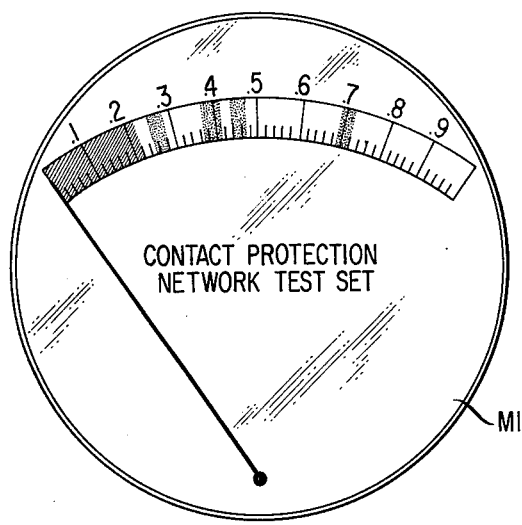
FIG. 4 illustrates the scale layout of the test set meter M1 set forth in FIG. 1.

Generator 10 is connected through on-off switch S1 to the series combination of capacitor C1, variable resistor R1, and the primary winding of impedance matching transformer T1. One side of the secondary winding of impedance matching transformer T1 is connected directly to lead 21 while the other side is connected through a contact protection network analyzing circuit to lead 22. The contact protection network analyzing circuit includes capacitor C2, meter M1, and bridge circuit 11 comprised of diodes D1, D2, D3, D4. Meter M1, having a range of 0 to 1 milliampere, is connected to bridge circuit 11 and is calibrated to define an operational status of a plurality of different types of contact protection networks. For testing contact protection networks used with wire spring relays, such as relay 4, the scale of meter M1, FIG. 4, is calibrated so that a range of 0 to 0.22 milliamperes indicates an open or missing contact protection network. Various types of operative and working contact protection networks are represented by calibrated scale indications of 0.25 to 0.28; 0.37 to 0.41; 0.44 to 0.47 and 0.69 to 0.72 milliamperes, respectively, while a full scale reading of 1 milliampere denotes a shorted contact protection network. Test set 1 is not limited for use with a 0 to 1 milliampere range meter M1 but may also be advantageously utilized with various and multi-range meters to test a large number of contact protection networks in many circuit applications.

Figure 2:
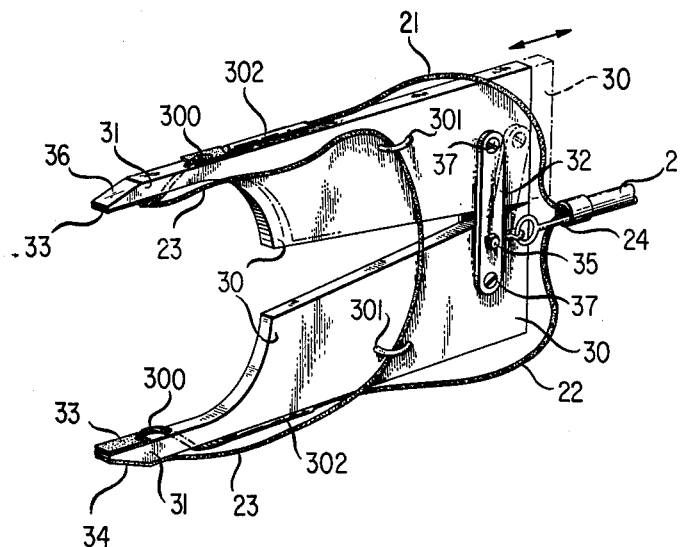
FIG. 2 represents an isometric view of connector apparatus for connecting the test set to contact protection networks.

Contacting apparatus set forth in FIG. 2 of the drawing is utilized for selectively connecting test set 1 to various types of contact protection networks associated with relay 4. The connecting apparatus hereinafter called test set connector 3 comprises a pair of elongated insulative members 30, each of which is extended into a tapered operative arm or end 31 characterized by tapered surface 36. Each of the elongated members 30 is fastened to a pair of hinged plates 32 arranged to enable both angular and parallel lateral movement of each elongated member 30 with respect to the other. The hinged plates 32 are affixed to each elongated member 30 by means of machine screws 37 so that the tapered operative end 31 of each elongated member 30 can be moved both forward and backward laterally with respect to the tapered operative end 31 of the other elongated member 30. Hinged plates 32 also enable each elongated member 30 to be rotated angularly with respect to the other elongated member 30 so that the tapered operative ends 31 can also be rotated both toward and away from each other.

Figure 3B:
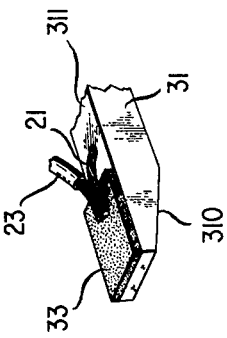
FIGS. 3A and 3B represent an isometric illustration of the contact elements attached to tapered operative ends of the connector apparatus set forth in FIG. 2.
Figure 3A:
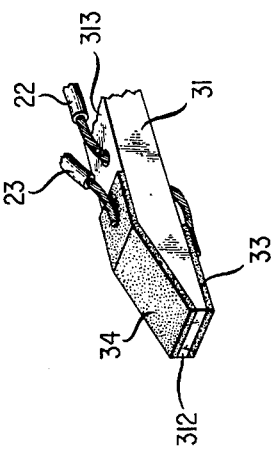

Referring to FIGS. 3A and 3B of the drawing, each tapered operative end 31 of elongated member 30 has both an inside facing surface 311 and a tapered surface 310 inclined to form an angle with inside facing surface 311. Similar first contact elements 33 are mounted on and attached to the inside facing surface 311 of each of the elongated arm tapered operative ends 31. Each of contact elements 33 is connected individually to one of leads 21, 22 coupled to transformer T1 and capacitor C22 of test set 1. Referring to FIG. 3A of the drawing, a second contact element 34 is formed to the angle required for mounting on surfaces 313 and 310 and is mounted and attached thereto on the outside of one elongated arm tapered operative end 31 opposite contact element 33. Contact element 34 is positioned on outside surface 313 and tapered surface 310 so that the end thereof is electrically separated by the insulative surface 312 of elongated arm 30 from contact element 33.

Formed contact element 34 mounted on the tapered operative end 31 of one elongated arm 30, FIG. 2, is connected by lead 23 to contact element 33 mounted on the other elongated arm 30 and is electrically equivalent thereto. Contact elements 33 are individually connected to one of leads 21, 22 each of which extend from a contact element 33 through a slanted opening 300 in each elongated arm 30 to multi-lead conductor 2. Leads 21, 22 are each individually secured to one elongated arm 30 by clip 302 and lead 23 is secured to both elongated arms 30 by clips 301 in such a manner so as to allow free movement of both tapered operative ends 31. Multi-lead conductor 2 is fastened to test connector 3 by strain relief clamp 24 that is secured to one of the hinge plates 32 by screw 35.

2. Test Set Operation

FIG. 1 of the drawing illustrates wire spring relay 4 of the type oftentimes used in communication switching systems. Relay 4 employed for the purpose of illustrating the utility of test set 1 comprises two coil windings 42, 43 positioned on mounting bracket 44. Each coil winding 42, 43 is terminated on terminals 45, 46 and 47, 48, respectively, which extend upward from the bottom of relay 4 through mounting bracket 44 and spoolheads 41.

Coil windings 42, 43 represent electrical circuits that are oftentimes controlled by the operation and release of the contacts of another relay. The controlling contacts of the other relay are protected by connecting contact protection network 5 across coil windings 42, 43 of relay 4. In some circuit applications leads 51 and 52 of contact protection network 5 are connected across coil winding terminals 45, 46 or 47, 48. In other circuit applications, contact protection network 5 may either be connected across coil winding terminals 45, 48; 46, 47 or other combinations of coil winding terminals. The flexibility of test connector 3 enables test set 1 to be used in each of these circuit applications to test relay contact protection networks such as contact protection network 5.

Test set 1 is first calibrated by operating switch S1 to the closed position and rotating the pair of elongated arms 30 of test connector 3 to short contact elements 33 on each elongated member 30 together. Variable resistor R1 is then adjusted to obtain full scale deflection reading on meter M1. When contact protection network 5, FIG. 1, is connected across relay coil windings 45 and 48 each elongated member 30 is moved to position contact elements 33 attached to the inside face of each tapered operative end 31 onto terminals 45 and 48 extending through spoolhead 41 of relay 4. The test signal is applied from generator 10 over leads 21, 22 through contact elements 33 and terminals 45 and 48 to contact protection network 5. The resulting current flowing through this circuit is rectified by bridge circuit 11 and measured by calibrated meter M1. If contact protection network 5 is electrically open or missing, no current will flow and meter M1 will read in the scale of 0 to 0.22 milliamperes that indicates a defective network. Should contact protection network 5 be shorted, maximum current will flow through bridge 11 to give a full scale reading on meter M1. A reading on the appropriate one of the marked scale calibrations of meter M1 indicates a functioning contact protection network 5 that protects relay contacts controlling operation of relay 4.

The flexibility of test connector 3 enables test set 1 to test different circuit configurations that include contact protection network 5. When contact protection network 5 is connected across terminls 47 and 48, the elongated arm 30 having the single contact element 33 is moved backward and swung out of the way. The other elongated arm 30 is positioned so that the tapered operative end 31 thereof is placed between terminals 47 and 48 in order that the first contact element 33 thereon engages terminal 48 and tapered contact element 34 engages terminal 47. Current is then applied to contact protection network 5 from test set 1 over a circuit path comprising lead 22, contact element 33, terminal 48 and leads 21, 23, tapered contact element 34 and terminal 47. The construction and flexibility of test connector 3 enables the movement of elongated members 30 so that the tapered operative ends 31 thereof can be used to selectively connect test set 1, via contact terminals 33 and 34 with various in-circuit configurations of contact protection networks.

SUMMARY

It is obvious from the foregoing that the facilities, economy, and efficiency of testing relay contact protection networks may be substantially enhanced by a test set arranged for enabling rapid in-circuit tests to be conducted on a wide range of contact protection network circuit applications. It is further obvious from the foregoing that test set apparatus arranged for enabling in-circuit tests to be conducted on a wide range of contact protection networks obliterates the need to take working equipment out of service, physically disconnect and remove a contact protection network to be tested on a separate impedance bridge testing circuit.

While the apparatus of the invention has been disclosed for use in testing communication types of relays, it is to be understood that such embodiment is intended to be illustrative of the principals of the invention and that other arrangements may be designed by those skilled in the art without departing from the spirit and intent of the invention.

What is claimed is:

1. A test set for testing contact protection networks comprising
   means for generating a test signal;
   means connected to said generating means for analyzing the contact protection networks; and
   means for selectively connecting said test set to ones of the contact protection networks comprising a pair of insulating elongated members each having a tapered operative end, contact means attached to said tapered operative end of one of said elongated members and to the tapered operative ends of both of said elongated members, hinge means supporting said elongated members for enabling both angular and parallel lateral relative movement thereof to selectively couple said contact means with ones of the contact protection networks, and conductor means for coupling said contact means with said analyzing means.

2. The test set defined in claim 1 wherein said analyzing means comprises
   a meter calibrated to define an operational status of ones of the contact protection networks in accordance with predetermined values of rectified test signals applied thereto, and
   bridge means connecting said generating means to said meter for rectifying a portion of said test signal applied to one of the contact protection networks and applying said rectified test signal to said meter.

3. The test set defined in claim 1 wherein said contact means comprises
   a pair of first contact elements each individually mounted on an inside facing surface of said tapered operative end of each one of said elongated members, and
   a second contact element mounted on a tapered surface of said tapered operative end of one of said elongated members opposite one of said first contact elements.

4. The test set defined in claim 3 wherein said conductor means comprises
   a multi-lead conductor having a pair of leads each individually secured to one of said elongated members for electrically connecting one of said first contact elements with said analyzing means, and
   a conducting lead secured to both said elongated members for electrically connecting said second contact element mounted on said one elongated member to the first contact element mounted on the other said elongated member.

5. A test set for testing contact protection networks comprising a signal generator for generating a test signal;

a meter calibrated to define an operational status of ones of the contact protection networks in accordance with predetermined values of rectified test signals applied thereto;

a bridge circuit connecting said signal generator to said meter for rectifying a portion of said test signal applied to ones of the contact protection networks and applying said rectified test signal to said meter; and a test connector for selectively connecting said test set to ones of the contact protection networks comprising two insulating elongated members each having a tapered operative arm, a pair of first contact elements each individually mounted on an inside facing surface of said tapered operative arm of each of said elongated members, a second contact element mounted on a tapered surface of said tapered operative arm of one of said elongated members opposite one of said first contact elements, a pair of hinge plates for supporting said elongated members and enabling both angular and parallel lateral relative movement of said tapered operative arms thereof to selectively couple said first contact elements and said second contact element and one of said first contact elements with said ones of the contact protection networks, a pair of conductor leads each individually secured to one of said elongated members for electrically connecting said first contact elements with said rectifying bridge and said signal generator, and a conducting lead for electrically connecting said second contact element mounted on said one elongated member to the first contact element mounted on the other said elongated member.

6. A test connector for use in selectively connecting a test signal generator and analyzing circuit of a test set with contact protection networks comprising a pair of insulating elongated members each having a tapered operative arm, a pair of first contact elements each individually attached to an inside facing surface of said tapered operative arm of each of said elongated members, a second contact element mounted on a tapered surface of said tapered operative arm of one of said elongated members opposite one of said first contact elements, a pair of hinge plates for supporting said elongated members to enable both angular and parallel lateral relative movement of said elongated member tapered operative arms to selectively connect said first and second contact elements with ones of the contact protection networks, and conducting means for electrically connecting said first contact elements with the test signal generator and analyzing circuit and said second contact element with one of said first contact elements.

* * * * *